United States Patent
Li et al.

(10) Patent No.: US 10,923,519 B2
(45) Date of Patent: Feb. 16, 2021

(54) PIXEL STRUCTURE FOR CMOS IMAGE SENSOR

(71) Applicant: Shanghai Huali Integrated Circuit Mfg. Co., Ltd., Shanghai (CN)

(72) Inventors: Yan Li, Shanghai (CN); Wuzhi Zhang, Shanghai (CN)

( * ) Notice: Subject to any disclaimer, the term of this patent is extended or adjusted under 35 U.S.C. 154(b) by 0 days.

(21) Appl. No.: 16/195,859

(22) Filed: Nov. 20, 2018

(65) Prior Publication Data

US 2020/0075654 A1  Mar. 5, 2020

(30) Foreign Application Priority Data

Aug. 31, 2018 (CN) .......................... 201811011091.3

(51) Int. Cl.
*H01L 27/146* (2006.01)

(52) U.S. Cl.
CPC .. *H01L 27/14623* (2013.01); *H01L 27/14636* (2013.01); *H01L 27/14685* (2013.01)

(58) Field of Classification Search
CPC .......................... H01L 27/14609–14893; H01L 27/14623–14645
See application file for complete search history.

(56) References Cited

U.S. PATENT DOCUMENTS

| | | | | |
|---|---|---|---|---|
| 2007/0102738 | A1* | 5/2007 | Adkisson | H01L 27/14623 257/292 |
| 2014/0203331 | A1* | 7/2014 | Tanaka | H01L 27/14641 257/231 |
| 2015/0084144 | A1* | 3/2015 | Suzuki | H01L 27/1463 257/432 |
| 2016/0133865 | A1* | 5/2016 | Yamaguchi | H01L 27/14632 257/40 |
| 2016/0218149 | A1* | 7/2016 | Yamaguchi | H01L 27/14612 |

* cited by examiner

*Primary Examiner* — Suberr L Chi
(74) *Attorney, Agent, or Firm* — Kilpatrick Townsend & Stockton, LLP

(57) ABSTRACT

The present invention provides a pixel structure for a CMOS image sensor and a manufacturing method therefor, the pixel structure comprising: a substrate; a floating diffusion region formed in the substrate; an interlayer dielectric layer formed on an upper surface of the substrate and covering the pixel structure; and a light-shielding wall formed in the interlayer dielectric layer, wherein a projection of the light-shielding wall in the height direction of the substrate surrounds a projection of the floating diffusion region in the height direction of the substrate. The present invention further provides a manufacturing method for manufacturing the pixel structure. The pixel structure manufactured by means of the manufacturing method provided in the present invention can shield the irradiation of incident light on the floating diffusion region of the global CMOS image sensor, thereby reducing interference signals.

8 Claims, 5 Drawing Sheets

PIXEL STRUCTURE FOR CMOS IMAGE SENSOR

CROSS-REFERENCES TO RELATED APPLICATIONS

The present application claims priority to Chinese Patent Application No. 201811011091.3, filed on Aug. 31, 2018, entitled "PIXEL STRUCTURE AND MANUFACTURING METHOD THEREFOR", which is incorporated by reference herein for all purposes.

FIELD

The present invention relates to the field of semiconductors, and particularly to the field of CMOS image sensors.

BACKGROUND OF THE DISCLOSURE

The use of a CMOS image sensor (CIS) has increased year by year since its manufacturing process is compatible with the existing integrated circuit manufacturing process, and its performance has many advantages compared with the original charge coupled device (CCD). The CMOS image sensor can integrate a driver circuit and a pixel together, so that since the CMOS image sensor can acquire an electrical signal while collecting an optical signal, it can process image information in real time, then it is much faster than the CCD image sensor. The CMOS image sensor also has many advantages, such as a low price, a large bandwidth, blur preventing, access flexibility and a large filling coefficient.

Generally, an active pixel unit of the CMOS image sensor includes a P+/N+/P− photo diode (PD) and several transistors. Taking a 4T-structure CMOS image sensor as an example, four transistors specifically include a transfer transistor (TX), a source follow transistor (SF), a reset transistor (RST), and a row select transistor (RS).

The 4T-structure CMOS image sensor works as follows: before illumination, turning on the reset transistor (RST) and the transfer transistor (TX) to release existing electrons in the photo diode (PD) region; during illumination, turning off all the transistors to generate charges in a space charge region of the photo diode (PD); and during reading, turning on the transfer transistor (TX) to transmit the charges stored in the PD region to a floating diffusion node (FD), and after the transmission, turning off the transfer transistor, and waiting for the entering of subsequent illumination. A charge signal on the floating node (FD) is then used to adjust the source follow transistor (SF), convert charges to a voltage, and output current to an analogue-to-digital conversion circuit via the row select transistor (RS). Due to the large dimension of the photo diode, the full well capacity (the capability of the photo diode to store charges) is improved, and more electrons can be stored, so that a dynamic range (the ratio of the brightest condition to the darkest condition) of the pixel unit can be improved, and the effect of noises on the pixel can be reduced, and the signal to noise ratio will be improved.

In the working process described above, light generated by an external non-photo diode will be irradiated on the floating diffusion region (FD), which affects the charges stored in the floating diffusion region (FD); and due to the time for storing an optical signal by a standard 4T-structure CMOS image sensor is at a us level, even if the floating diffusion region (FD) receives external parasitic light, the influence of the light is not large and can generally be ignored.

At present, the CMOS image sensor has been developed into a 5T structure, and a 5T structure CMOS image sensor has added a global shutter on the basis of the 4T-structure CMOS image sensors. The time for storing an optical signal by the 5T structure CMOS image sensor is at an ms level, and the storage time is increased by several thousand times compared with the 4T-structure CMOS image sensor, thus leading to a significant increase in the time for irradiation of the parasitic light on the floating diffusion region (FD). The light pollution caused by the parasitic light on the floating diffusion region (FD) affects the capacitance of the floating diffusion region (FD), resulting in deterioration of the performance of the 5T structure CMOS image sensor.

Therefore, there is an urgent need for a pixel structure which is capable of shielding irradiation of parasitic light on the floating diffusion region (FD), thereby reducing the influence of the parasitic light on the capacitance of the floating diffusion region (FD), and improving the performance of the CMOS image sensor.

BRIEF SUMMARY OF THE DISCLOSURE

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

As described above, in order to shield parasitic light irritated on a floating diffusion region (FD), and to reduce the effect of the parasitic light on the capacitance of the floating diffusion region (FD), thereby improving the performance of a CMOS image sensor. The present invention provides a pixel structure for a CMOS image sensor, the pixel structure comprising: a substrate; a floating diffusion region formed in the substrate; an interlayer dielectric layer formed on an upper surface of the substrate and covering the pixel structure; and a light-shielding wall formed in the interlayer dielectric layer, wherein a projection of the light-shielding wall in the height direction of the substrate surrounds a projection of the floating diffusion region in the height direction of the substrate.

In the embodiment described above, the pixel structure provided in the present invention is provided with a light-shielding wall of a certain height formed in the interlayer dielectric layer, which forms encasing in the vertical direction for the floating diffusion region, thereby effectively blocking obliquely incident parasitic light, and reducing the influence of the parasitic light on the capacitance of the floating diffusion region.

In the pixel structure as described above, optionally, the projection of the light-shielding wall in the height direction of the substrate is in a hollow rectangle shape.

In the pixel structure as described above, optionally, the material of the light-shielding wall comprises metal.

In the pixel structure as described above, optionally, the metal comprises tungsten. In the embodiment described above, the material of the light-shielding wall is metallic tungsten, and in the current semiconductor technology, the metallic tungsten has a superior light-shielding effect, and the material is compatible with the contact hole in a semiconductor device, thus having operability.

In the pixel structure as described above, optionally, a contact etching stop layer is further formed between the substrate and the interlayer dielectric layer, and the light-shielding wall is formed on an upper surface of the contact etching stop layer.

In the pixel structure as described above, optionally, a contact plug is further formed in a portion, surrounded by the light-shielding wall, of the interlayer dielectric layer, wherein the contact plug penetrates through the contact etching stop layer to get in electrical contact with the floating diffusion region.

In the pixel structure as described above, optionally, the contact plug and the light-shielding wall are both made of metallic tungsten.

In the pixel structure as described above, optionally, a light shielding layer is further formed on an upper surface of the interlayer dielectric layer, wherein a projection of the light-shielding layer in the height direction of the substrate covers at least a projection of the floating diffusion region in the height direction of the substrate. In the embodiment described above, a light-shielding layer covering the floating diffusion region in the horizontal direction is further formed, which can effectively block perpendicularly incident parasitic light and cooperate with the light-shielding wall that encases the floating diffusion region in the vertical direction, and which can block the parasitic light incident on the floating diffusion region omnidirectionally, thereby further reducing the influence of the parasitic light on the capacitance of the floating diffusion region.

In the pixel structure as described above, optionally, the material of the light-shielding layer is metallic copper, wherein the light-shielding layer is in electrical contact with an upper surface of the contact plug, and the projection of the light-shielding layer in the height direction of the substrate further comprises a lead portion to lead out the contact plug. In the embodiment described above, the light-shielding layer is a metal layer M1 (lead layer) in the back-end-of-line process for semiconductor device, and by drawing a dummy pattern on the original lead layer, the projection of the dummy pattern in the height direction of the substrate can completely cover the floating diffusion region, thereby achieving the multiplexing of the lead layer and the light-shielding layer by means of a simple process.

The present invention further provides a CMOS image sensor comprising any one of the above pixel structures. In the CMOS image sensor including the pixel structure provided in the present invention, the parasitic light incident into the floating diffusion region can be effectively blocked, so as not to affect the capacitance of the floating diffusion region, thereby not affecting the performance of the CMOS image sensor.

The present invention further provides a manufacturing method for a pixel structure, wherein the pixel structure is used for a CMOS image sensor, the manufacturing method comprising: providing a substrate in which a floating diffusion region of the pixel structure is formed; forming, on a surface of the substrate, an interlayer dielectric layer covering the floating diffusion region; etching the interlayer dielectric layer to form a trench in the interlayer dielectric layer, wherein a projection of the trench in the height direction of the substrate surrounds a projection of the floating diffusion region in the height direction of the substrate; and filling a light-shielding medium in the trench to form a light-shielding wall. The manufacturing method provided in the present invention can manufacture the above-mentioned pixel structure that functions to block the parasitic light; moreover, the light-shielding wall is formed in the interlayer dielectric layer, which is processed in the back-end-of-line process for semiconductor device. Since the processes of etching and then filling the trench in the interlayer dielectric layer are relatively perfect in the back-end-of-line process, for example, etching of a contact hole, therefore, the manufacturing method provided in the present invention has operability in process and is compatible with the existing processes.

In the manufacturing method as described above, optionally, the step of etching the interlayer dielectric layer further comprises patterning the interlayer dielectric layer to define the shape of the trench, wherein a projection of the trench in the height direction of the substrate is defined to be in a hollow rectangle shape.

In the manufacturing method as described above, optionally, the light-shielding medium comprises metal.

In the manufacturing method as described above, optionally, the metal is tungsten.

The manufacturing method as described above, optionally, further comprises: etching a portion, surrounded by the light-shielding wall, of the interlayer dielectric layer to form a contact hole, which exposes the floating diffusion region, in the interlayer dielectric layer; and filling a conductive medium in the contact hole to form a contact plug that is in electrical contact with the floating diffusion region.

In the manufacturing method as described above, optionally, the step of forming the interlayer dielectric layer further comprises forming, on the surface of the substrate, a contact etching stop layer covering the pixel structure; forming the interlayer dielectric layer on a surface of the contact etching stop layer; the step of forming the trench further comprises etching the interlayer dielectric layer, so that the trench exposes the contact etching stop layer; and the step of forming the contact hole further comprises etching the interlayer dielectric layer and the contact etching stop layer, so that the contact hole exposes the floating diffusion region. In the embodiment described above, the medium in the contact hole needs to be electrically connected to the floating diffusion region, therefore, in the step of etching the contact hole, the contact etching stop layer needs to be etched through; and the light-shielding wall is formed on the contact etching stop layer, therefore, the trench forming the light-shielding wall should not etch through the contact etching stop layer, and the etching of the contact hole should not be performed simultaneously with the etching of the trench.

In the manufacturing method as described above, optionally, the light-shielding medium and the conductive medium are both made of metallic tungsten, and the light-shielding medium and the conductive medium are filled in the same step. In the embodiment described above, the conductive medium filled in the contact hole and the light-shielding medium used by the light-shielding wall are both made of metallic tungsten. As described above, in the current semiconductor processes, the metallic tungsten has a superior light-shielding property and is compatible with the contact hole processes; therefore, although the trench of the light-shielding wall cannot be etched synchronously with the contact hole, the filling of the light-shielding wall and the filling of the contact hole can be implemented in the same step of process, thereby simplifying the process flow, and having operability and compatibility.

The manufacturing method as described above, optionally, further comprises: forming a light-shielding layer on the interlayer dielectric layer, wherein a projection of the light-shielding layer in the height direction of the substrate covers at least a projection of the floating diffusion region in the height direction of the substrate.

In the manufacturing method as described above, optionally, the material of the light-shielding layer is metallic copper, wherein the light-shielding layer is in electrical contact with an upper surface of the contact plug, and the projection of the light-shielding layer in the height direction of the substrate further comprises a lead portion to lead out the contact plug. As described above, the forming of the light-shielding layer is performed synchronously with the forming of the lead layer in the back-end-of-line process for semiconductor, and is compatible with the existing processes by designing a dummy pattern on the lead layer, and achieves the multiplexing of the light-shielding layer and the lead layer while simplifying the process flow.

The pixel structure for a CMOS image sensor and the manufacturing method therefor provided in the present invention are compatible with the existing processes and have operability. By providing the light-shielding wall surrounding the floating diffusion region, the incident parasitic light is effectively shielded to reduce the influence on the capacitance of the floating diffusion region, thereby optimizing the performance of the pixel structure and the CMOS image sensor.

REFERENCE NUMERALS

Figure 1:
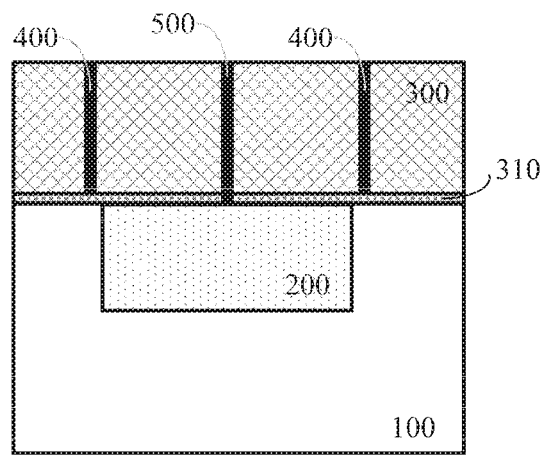
FIG. 1 shows a schematic cross-sectional view of an embodiment of a pixel structure provided in the present invention.

100 Substrate
200 Floating diffusion region
300 Interlayer dielectric layer
310 Contact etching stop layer
400 Light-shielding wall
410 Trench
500 Contact plug
510 Contact hole
600 Light-shielding layer
910 Pixel region active zone
911 Device active zone
912 Floating diffusion region
921 Gate of global shutter
922 Gate of transfer transistor
923 Gate of reset transistor
924 Gate of source follow transistor
925 Gate of row select transistor
930 Light-shielding wall
940 Contact plug
950 Light-shielding layer

DETAILED DESCRIPTION OF THE DISCLOSURE

The present invention relates to a semiconductor process and device. More specifically, an embodiment of the present invention provides a pixel structure for a CMOS image sensor, wherein a light-shielding wall is provided in an interlayer dielectric layer of the pixel structure, the light-shielding wall surrounding a floating diffusion region. Other embodiments are further provided.

The following description is presented to enable one of ordinary skill in the art to implement and use the invention and incorporate it into the context of a particular application. Various modifications, as well as various uses in various applications, will be readily apparent to those skilled in the art, and the generic principles defined herein may be applicable to a wide range of embodiments. Thus, the present invention is not limited to the embodiments presented herein, but rather should be given its broadest scope consistent with the principles and novel features disclosed herein.

In the following detailed description, numerous specific details are set forth to provide a more thorough understanding of the present invention. However, it will be apparent to those skilled in the art that the present invention may not necessarily be limited to these specific details. In other words, well-known structures and devices are shown in the block diagram form and are not shown in detail to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by alternative features serving the same, equivalent, or similar purpose. Therefore, unless expressly stated otherwise, each feature disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 2:
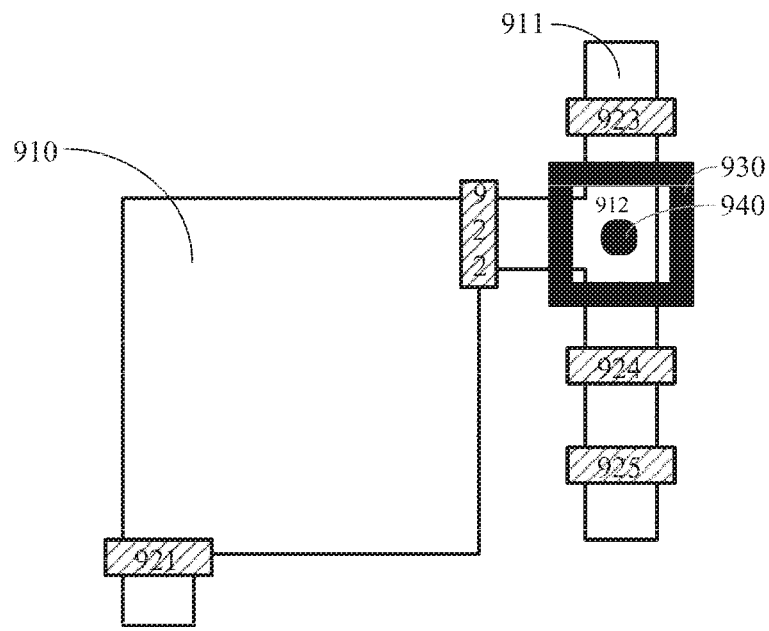
FIG. 2 shows a top planar schematic view of an embodiment of a pixel structure provided in the present invention.

As described above, in order to solve the problem of the influence on the performance of a pixel unit due to the influence on the capacitance of the floating diffusion region resulted from the incidence of parasitic light on a floating diffusion region, the present invention provides a pixel structure. With reference to FIG. 1, FIG. 1 shows a schematic cross-sectional view of an embodiment of a pixel structure provided in the present invention, the pixel structure provided in the present invention comprising: a substrate 100; a floating diffusion region 200 formed in the substrate 100; an interlayer dielectric layer 300 formed on an upper surface of the substrate 100 and covering the pixel structure; and a light-shielding wall 400 formed in the interlayer dielectric layer 300, wherein a projection of the light-shielding wall 400 in the height direction of the substrate surrounds a projection of the floating diffusion region 200 in the height direction of the substrate. As can be seen from FIG. 1, the light-shielding wall 400 formed in the interlayer dielectric layer 300 has a certain height, and forms encasing in the vertical direction for the floating diffusion region 200. In combination with FIG. 2, FIG. 2 shows a top planar schematic view of the above-mentioned embodiment, wherein a projection of the light-shielding wall 930 in the height direction of the substrate surrounds the floating diffusion region 912. By providing the light-shielding wall, obliquely incident parasitic light can be effectively blocked to reduce the influence of the parasitic light on the capacitance of the floating diffusion region.

In the embodiment shown in FIGS. 1 and 2, a contact etching stop layer 310 is further formed between the interlayer dielectric layer 300 and the substrate 100, and the light-shielding wall 400 is formed on the upper surface of the contact etching stop layer 310, so that the light-shielding wall 400 is electrically isolated from the floating diffusion region 200. The contact etching stop layer 310 includes, but is not limited to, a nitride film, and the material of the interlayer dielectric layer includes, but is not limited to, oxide.

In the embodiment described above, a contact plug 500 for the floating diffusion region 200 is further formed in a portion, surrounded by the light-shielding wall 400, of the interlayer dielectric layer 300. As can be seen from FIG. 1, the contact plug 500 penetrates through the contact etching stop layer 310 to get electrically connected to the floating diffusion region 200. As shown in FIG. 2, since the light-shielding wall 930 surrounds the floating diffusion region 912, the contact plug 940 is formed inside the light-shielding wall 930; and since the contact plug 940 is electrically connected to the floating diffusion region 912 and the light-shielding wall 930 is electrically isolated from the floating diffusion 912, the projection of the light-shielding wall 930 in the height direction of the substrate is in a hollow pattern, for example, a hollow rectangle as shown in FIG. 2.

In an embodiment, the material of the light-shielding wall is metal having the light-shielding property, e.g., metallic copper, metallic tungsten, etc. More preferably, the above-mentioned metal is the metallic tungsten having superior light-shielding effect in the current semiconductor processes. Those skilled in the art should appreciate that the above-mentioned examples of metal having the light-shielding property are not to limit the material of the light-shielding wall, and those skilled in the art can select an existing or a future light-shielding medium having a better light-shielding effect.

In the embodiment in which the material of the light-shielding wall is metallic tungsten, preferably, the material of the contact plug is also metallic tungsten, so that the processes of forming the light-shielding wall and of forming the contact plug are compatible.

Those skilled in the art should appreciate that the pixel structure may further comprise other structures and devices for implementing the function of the CMOS image sensor, such as a photo diode, an RPD, a transfer transistor, a reset transistor, a source follow transistor, and a row select transistor. In combination with FIG. 2, FIG. 2 shows a pixel region active zone 910, a gate of global shutter 921, a gate of transfer transistor 922, a gate of reset transistor 923, a gate of source follow transistor 924, and a gate of row select transistor 925 corresponding to the photo diode, and the floating diffusion region 912 is provided in a device active zone 911 corresponding to the reset transistor, the source follow transistor, and the row select transistor.

Figure 3:
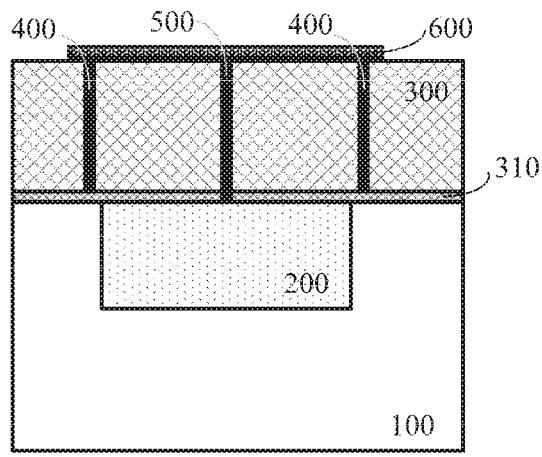
FIG. 3 shows a schematic cross-sectional view of another embodiment of a pixel structure provided in the present invention.
Figure 4:
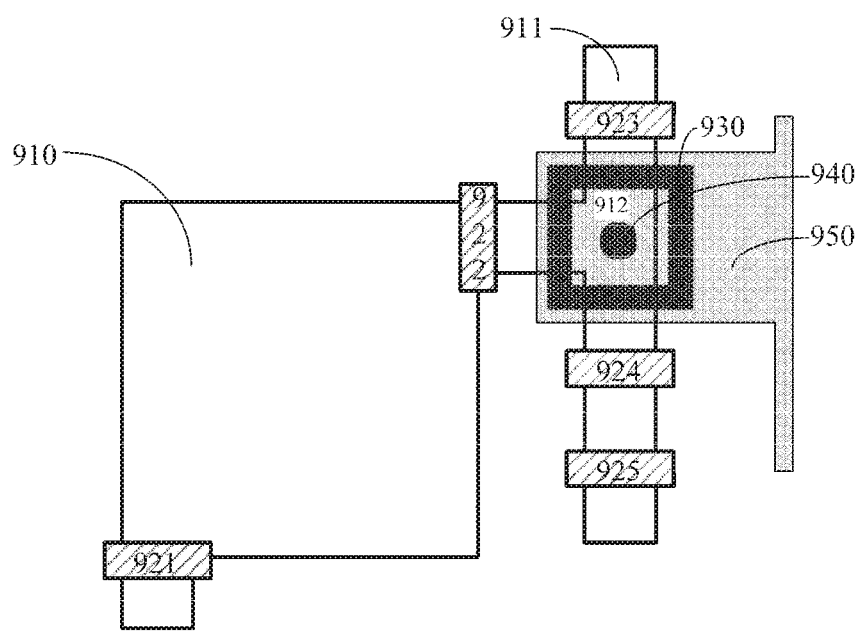
FIG. 4 shows a top planar schematic view of another embodiment of a pixel structure provided in the present invention.

In the embodiment described above, providing the light-shielding wall in the interlayer dielectric layer can effectively block the oblique incidence of the parasitic light into the floating diffusion region. In another embodiment, furthermore, the pixel structure provided in the present invention further comprises a light-shielding layer provided on the upper surface of the interlayer dielectric layer. With reference to FIG. 3, FIG. 3 shows a schematic cross-sectional view of another embodiment of the pixel structure provided in the present invention. A light-shielding layer 600 is formed on the upper surface of the interlayer dielectric layer 300 of the pixel structure as shown in FIG. 3, and a projection of the light-shielding layer 600 in the height direction of the substrate 100 covers at least a projection of the floating diffusion region 200 in the height direction of the substrate 100. In combination with FIG. 4, FIG. 4 shows a top planar schematic view of the above-mentioned embodiment, and those skilled in the art should appreciate that although the light-shielding layer 950 is depicted transparently in the figure to better show the relationships between the light-shielding layer 950 and the floating diffusion region 912, the light-shielding wall 930 and the contact plug 940 in FIG. 4, the light-shielding layer 950 is actually located above the floating diffusion region 912, the light-shielding wall 930, and the contact plug 940. The light-shielding layer 950 covers the floating diffusion region 912 in the horizontal direction, which can effectively block perpendicularly incident parasitic light and cooperate with the light-shielding wall that encases the floating diffusion region in the vertical direction, and which can block the parasitic light incident on the floating diffusion region omnidirectionally, thereby further reducing the influence of the parasitic light on the capacitance of the floating diffusion region.

In an embodiment, the material of the light-shielding layer is metal having the light-shielding property, and more preferably, the metal is metallic copper. Those skilled in the art should appreciate that in a common semiconductor structure, above the interlayer dielectric layer, there is generally a lead layer (M1, metal 1) for leading out various contact plugs, and the common material of the lead layer is metallic copper. In an embodiment in which the material of the light-shielding layer is metallic copper, for the light-shielding layer, by drawing a dummy pattern on the original lead layer, the projection of the dummy pattern in the height direction of the substrate can completely cover the floating diffusion region and lead out the contact plug 940, thereby achieving the multiplexing of the lead layer and the light-shielding layer by means of a simple process. Therefore, as shown in FIG. 4, although it is only illustrative, the projection of the light-shielding layer 950 in the height direction of the substrate covers not only the floating diffusion region 912, but also the rest of the lead portion; and those skilled in the art can design the specific lead portion according to the existing or future technology, which will not be described herein.

The pixel structure provided in the present invention can effectively block the parasitic light incident into the floating diffusion region, so as not to affect the capacitance of the floating diffusion region, thereby not affecting the performance of the CMOS image sensor.

The present invention further provides a CMOS image sensor including the above-mentioned pixel structure. By using the pixel structure provided in the present invention, the capacitance of the floating diffusion region will not be affected by a source of parasitic light, so that the CMOS image sensor has a superior performance.

Figure 5:
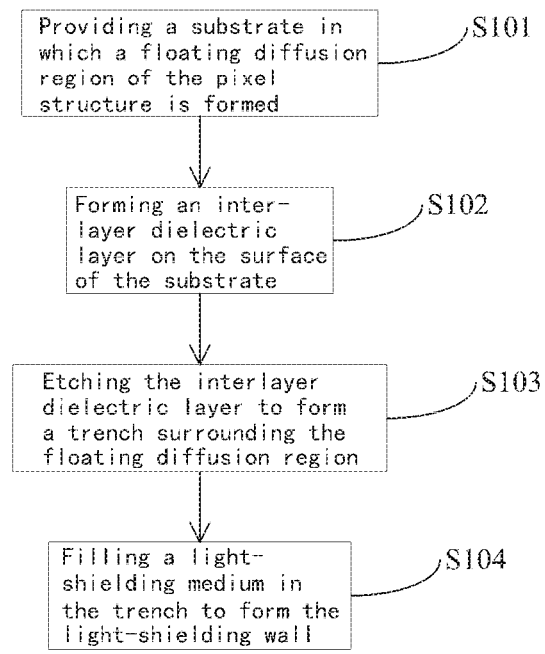
FIG. 5 shows a flow chart of an embodiment of a manufacturing method for a pixel structure provided in the present invention.

The present invention further provides a manufacturing method for manufacturing the above-mentioned pixel structure, and FIG. 5 shows a flow chart of the manufacturing method. Firstly, step S101 is performed: providing a substrate, wherein the substrate can be a semiconductor wafer such as a silicon wafer or a silicon epitaxial layer on the wafer. Alternatively or additionally, the substrate may include an elemental semiconductor material, a compound semiconductor material, and/or an alloy semiconductor material. Examples of elemental semiconductor materials may be, but are not limited to, crystalline silicon, polycrystalline silicon, amorphous silicon, germanium, and/or diamond. Examples of compound semiconductor materials may be, but not limited to, silicon carbide, gallium arsenide, gallium phosphide, indium phosphide, indium arsenide, and/or indium antimonide. Examples of alloy semiconductor materials may be, but not limited to, SiGe, GaAsP, AlInAs, AlGaAs, GaInAs, GaInP, and/or GaInAsP.

Moreover, in the above step, a floating diffusion region of a CMOS image sensor, as well as other devices formed by means of a front-end-of-line process for semiconductor, are formed in the substrate. The method provided in the present invention is mainly to improve a back-end-of-line process for semiconductor.

Figure 6A:
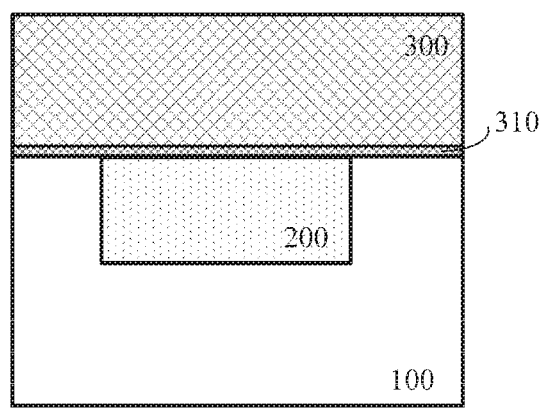
FIGS. 6A-6E are schematic cross-sectional views in a manufacturing process for a pixel structure provided in the present invention.

Step S102 is performed: forming an interlayer dielectric layer on the surface of the substrate. In the manufacturing method for the pixel structure provided in the present invention, the above steps S101 and S102 can both be implemented by means of the existing or future technology in the art, which will not be described herein. The material of the interlayer dielectric layer 300 includes, but is not limited to, oxide. In combination with FIG. 6A, FIG. 6A shows a schematic structural diagram of the forming of a floating diffusion region 200 in the substrate 100 and the forming of the interlayer dielectric layer 300 on the surface of the substrate 100.

Figure 6B:
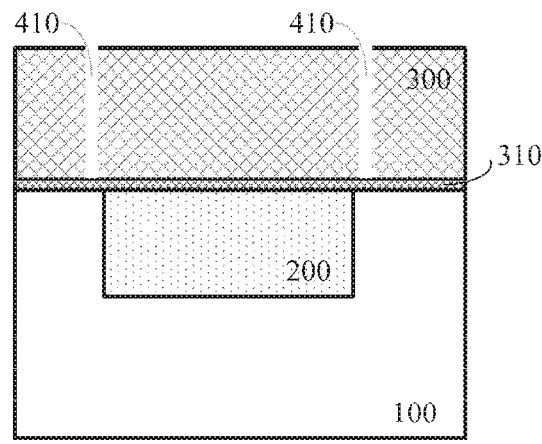

Step S103 is performed: etching the interlayer dielectric layer to form a trench surrounding the floating diffusion region. In combination with FIG. 6B, a trench 410 is etched in the interlayer dielectric layer 300, and the projection of the trench 410 in the height direction of the substrate 100 surrounds the floating diffusion region 200.

For the pixel structure with a light-shielding wall provided in the present invention, the forming of the light-shielding wall is in the back-end-of-line process for semiconductor process, and in particular, can be compatible with the existing contact plug (CT) process flow. The above process of forming the trench 410 can be implemented by means of the existing or future process for etching a contact hole, which will not be described herein. However, it should be noted by those skilled in the art that the contact plug (CT) is used for electrical connection to the floating diffusion region, while the light-shielding wall does not need to be electrically connected to the floating diffusion region. In the present embodiment, the step of forming the interlayer dielectric layer 300 future comprises: forming a contact etching stop layer 310 on the upper surface of the substrate 100 by means of the existing or future technology, and forming the interlayer dielectric layer 300 on the upper surface of the contact etching stop layer 310, wherein the contact etching stop layer 310 includes, but is not limited to, a nitride film. Also, in step S103, the trench formed by means of etching does not penetrate through the contact etching stop layer 310.

After the step S103, step S104 is performed: filling a light-shielding medium in the trench to form the light-shielding wall that blocks the parasitic light. As described above, the filling process can also be compatible with the filling process for the contact plug (CT), which will not be described herein. In an embodiment, the filled light-shielding medium is metal having the light-shielding property, and more preferably, the metal is metallic tungsten. Although the filling process can be compatible with the filling process for the contact plug (CT), in an embodiment in which the filled light-shielding medium is made of metallic tungsten, the thickness of the metallic tungsten seed is adjusted accordingly, and the W seed is thinned to improve the subsequent W filling ability; and due to changes in a transmission rate of the filling of metallic tungsten, a CMD grinding time is adaptively adjusted to ensure good device performance and subsequent process windows.

Those skilled in the art should appreciate that the above-mentioned examples of metal having the light-shielding property are not to limit the material of the light-shielding wall, and those skilled in the art can select an existing or a future light-shielding medium having a better light-shielding effect.

Figure 6C:
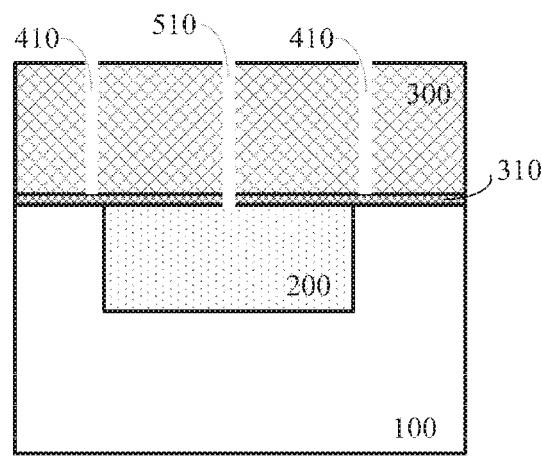

In an embodiment in which the light-shielding medium is made of metallic tungsten, more preferably, after performing the above step S103, the step S104 is not directly performed, instead, a contact hole 510 of the floating diffusion region 200 is formed in the interlayer dielectric layer, as shown in the FIG. 6C. Furthermore, after the step S103, a sacrificial medium is deposited in the formed trench, preferably, a bottom anti-reflective coating (BARC) can be filled, and a BARC layer and a subsequent photoresist layer are deposited on the upper surface of the interlayer dielectric layer filled with the BARC, and the etching of the contact hole 510 is implemented according to the existing or future contact hole etching process.

It should be noted that, different from the etching of the trench, the etching of the contact hole 510 needs to etch through the contact etching stop layer 310, so that a conductive medium filled in the contact hole is electrically connected to the floating diffusion region.

After forming the trench 410 and the contact hole 510, step S104 is performed: filling the trench 410 and the contact hole 510. Since the material of the existing contact plug is mainly metallic tungsten, in an embodiment in which the light-shielding medium is made of metallic tungsten, the filling of the trench 410 and of the contact hole 510 can be implemented in the same process step, thereby simplifying the process flow.

Figure 6D:
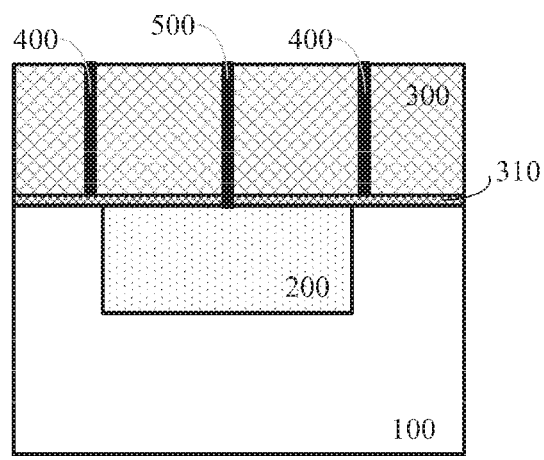

FIG. 6D shows a cross-sectional view of the pixel structure after the step S104. In the pixel structure shown in FIG. 6D, a light-shielding wall surrounding the floating diffusion region has been formed, which can effectively block parasitic light obliquely incident into the floating diffusion region 200, and reduce the effect on the capacitance of the floating diffusion region 200, thereby improving the performance of the pixel unit.

Figure 6E:
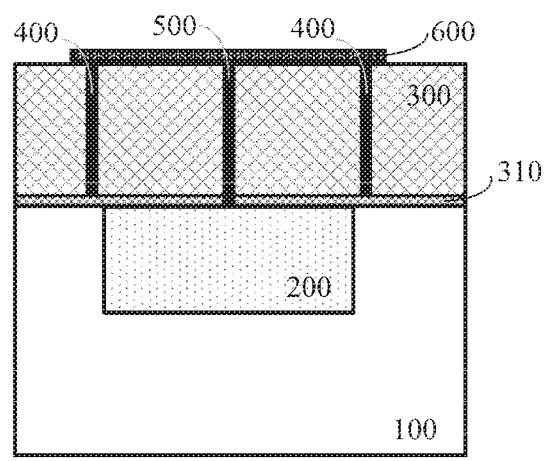

In another embodiment, furthermore, the manufacturing method provided in the present invention further comprises: forming a light-shielding layer 600 provided on the upper surface of the interlayer dielectric layer 300. In combination with FIG. 6E, the light-shielding layer 600 is formed on the upper surface of the interlayer dielectric layer 300 of the pixel structure as shown in FIG. 6E, and the projection of the light-shielding layer 600 in the height direction of the substrate 100 covers at least the projection of the floating diffusion region 200 in the height direction of the substrate 100. Since the light-shielding layer 600 covers the floating diffusion region 200 in the horizontal direction, it can effectively block perpendicularly incident parasitic light and cooperate with the light-shielding wall that encases the floating diffusion region in the vertical direction, and can block the parasitic light incident on the floating diffusion region omnidirectionally, thereby further reducing the influence of the parasitic light on the capacitance of the floating diffusion region.

In an embodiment, the material of the formed light-shielding layer is metal having the light-shielding property, and more preferably, the metal is metallic copper. Those skilled in the art should appreciate that in the common back-end-of-line process for semiconductor, it is necessary to further form a lead layer (M1, metal 1) above the interlayer dielectric layer for leading out various contact plugs, and the common material of the lead layer is metallic copper. In an embodiment in which the material of the light-shielding layer is metallic copper, the step of forming the light-shading layer can be conducted by drawing a dummy pattern in a step of forming the original lead layer, so that the projection of the dummy pattern in the height direction of the substrate can completely cover the floating diffusion region and lead out the contact plug, thereby achieving the multiplexing of the lead layer and the light-shielding layer by means of a simple process. Those skilled in the art can form specific the lead portion and the dummy graphic portion according to the existing or future technology, which will not be described herein.

The manufacturing method provided in the present invention can be compatible with the existing back-end-of-line process for semiconductor in terms of process flow, and can manufacture a pixel structure having the function of blocking parasitic light by means of a simple process flow, so that the manufacturing method has operability, and can achieve the mass-production of the pixel structure provided in the present invention.

So far, the embodiments of the pixel structure with the light-shielding wall have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A pixel structure for a CMOS image sensor, the pixel structure comprising:
    a substrate;
    a floating diffusion region formed in the substrate;
    an interlayer dielectric layer formed on an upper surface of the substrate and covering the floating diffusion region; and
    a light-shielding wall formed in the interlayer dielectric layer, wherein a projection of the light-shielding wall in a height direction of the substrate surrounds a projection of the floating diffusion region in the height direction of the substrate; and
    a contact plug formed in a portion, surrounded by the light-shielding wall, of the interlayer dielectric layer, wherein the contact plug is in electrical contact with the floating diffusion region.

2. The pixel structure of claim 1, wherein the projection of the light-shielding wall in the height direction of the substrate is in a hollow rectangle shape.

3. The pixel structure of claim 1, wherein a material of the light-shielding wall comprises metal.

4. The pixel structure of claim 3, wherein the metal comprises tungsten.

5. The pixel structure of claim 1, wherein a contact etching stop layer is further formed between the substrate and the interlayer dielectric layer, and the light-shielding wall is formed on an upper surface of the contact etching stop layer, wherein the contact plug penetrates through the contact etching stop layer to get in electrical contact with the floating diffusion region.

6. The pixel structure of claim 1, wherein the contact plug and the light-shielding wall are both made of metallic tungsten.

7. The pixel structure of claim 1, further comprising:
    a light-shielding layer formed on an upper surface of the interlayer dielectric layer.

8. A CMOS image sensor comprising the pixel structure of claim 1.

* * * * *